(12) United States Patent
Terashima et al.

(10) Patent No.: US 7,755,168 B2
(45) Date of Patent: Jul. 13, 2010

(54) SEMICONDUCTOR DEVICE PROVIDED WITH FLOATING ELECTRODE

(75) Inventors: Tomohide Terashima, Chiyoda-ku (JP); Shiori Uota, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 594 days.

(21) Appl. No.: 11/738,039

(22) Filed: Apr. 20, 2007

(65) Prior Publication Data

US 2008/0093707 A1 Apr. 24, 2008

(30) Foreign Application Priority Data

Oct. 19, 2006 (JP) .............................. 2006-285170

(51) Int. Cl.
*H01L 29/70* (2006.01)

(52) U.S. Cl. .............................. 257/587; 257/E29.171; 257/565; 438/309

(58) Field of Classification Search ......... 257/565–593, 257/E29.171; 438/309–378
See application file for complete search history.

(56) References Cited

U.S. PATENT DOCUMENTS 5,747,846 A 5/1998 Iida et al.

2002/0005546 A1 1/2002 Kawata

FOREIGN PATENT DOCUMENTS

| JP | 56-98839 | 8/1981 |
| JP | 58-77254 | 5/1983 |
| JP | 59-94861 | 5/1984 |
| JP | 11-330431 | 11/1990 |
| JP | 2611450 | 4/1991 |
| JP | 7-147340 | 6/1995 |
| JP | 9-293729 | 11/1997 |
| JP | 2004-158889 | 6/2004 |

OTHER PUBLICATIONS

U.S. Appl. No. 11/747,550, filed May 11, 2007, Terashima.
U.S. Appl. No. 12/261,148, filed Oct. 30, 2008, Terashima.

*Primary Examiner*—Kiesha R Bryant
*Assistant Examiner*—Tucker Wright
(74) *Attorney, Agent, or Firm*—Oblon, Spivak, McClelland, Maier & Neustadt, L.L.P.

(57) ABSTRACT

A semiconductor device has a first conductivity-type first semiconductor region, a second conductivity-type second semiconductor region and a second conductivity-type third semiconductor region both located on or above the first semiconductor region, a second conductivity-type fourth semiconductor region between the second semiconductor region and the third semiconductor region, and a first conductivity-type fifth semiconductor region between the third semiconductor region and the fourth semiconductor region. The fourth semiconductor region and the fifth semiconductor region are electrically connected by a conductive member. A distance between the fourth semiconductor region and the third semiconductor region is larger than a width of the fourth semiconductor region.

15 Claims, 7 Drawing Sheets

SEMICONDUCTOR DEVICE PROVIDED WITH FLOATING ELECTRODE

BACKGROUND OF THE INVENTION

1. Field of the Invention

The present invention relates to a semiconductor device.

2. Description of the Background Art

In a semiconductor device, a parasitic element that exerts an action different from an intended action may be formed depending on an internal configuration, resulting in a parasitic action. The parasitic action adversely affects an original action of the semiconductor device, and hence there have conventionally been studied various configurations of the semiconductor device to suppress the parasitic action.

Japanese Patent Laying-Open No. 09-293729 discloses a semiconductor device in which an N-type epitaxial layer is formed on a P-type silicon substrate, and a P-type region is formed in the N-type epitaxial layer to penetrate the same in a vertical direction to change the N-type epitaxial layer into islands separated in an insulated manner. It is disclosed therein that, in the semiconductor device, the islands are used to form an NPN bipolar transistor, and that the semiconductor device is irradiated with protons from a surface side of the P-type silicon substrate to form a carrier recombination layer in the P-type silicon substrate.

Japanese Patent Laying-Open No. 58-077254 discloses a logic integrated circuit device including a P-type monocrystalline silicon substrate coupled to a negative power supply potential, a first N-type epitaxial region located at a surface of the silicon substrate and having a logic signal input therein, a second N-type epitaxial region located at the surface of the silicon substrate to be spaced apart from the first N-type epitaxial region and coupled to the negative power supply potential, a third N-type epitaxial region located at the surface of the silicon substrate to be spaced apart from the first and second N-type epitaxial regions, coupled to a positive power supply potential via load-resistor means, and turning to logic "1" if the first N-type epitaxial region is at logic "0", and a P-type separation region separating the first, second, and third N-type epitaxial regions from one another in an insulated manner.

Japanese Patent Laying-Open No. 59-094861 discloses a semiconductor integrated circuit device including a semiconductor layer formed on a first conductivity-type semiconductor substrate and having an approximately uniform concentration distribution of prescribed conductivity-type impurities, a second conductivity-type first well region formed at a prescribed site of a surface of the semiconductor layer, a first conductivity-type second well region formed to surround the first well region at the surface of the semiconductor layer, a second conductivity-type first embedded region provided between the first well region and the semiconductor substrate adjacently thereto, and having a higher impurity concentration than the first well region has, a first conductivity-type second embedded region provided between the second well region and the semiconductor substrate adjacently thereto, and having a higher impurity concentration than the second well region has, and an active element formed in each of the first well region and the second well region.

In a semiconductor device, one conductivity-type region, the other conductivity-type region, and the like are formed at a substrate to configure various elements. As described above, the regions of the respective conductivity types are formed in proximity to one another, and hence there may occur a parasitic action, which is different from the original purpose.

An example of the semiconductor device is a bipolar transistor formed at a surface of the semiconductor substrate. Among the bipolar transistors, an npn bipolar transistor is formed such that an n-type semiconductor region, a p-type semiconductor region, and an n-type semiconductor region are formed at a surface of a p-type semiconductor substrate. In such a transistor, a parasitic transistor is also configured inside the semiconductor substrate, which may cause a parasitic action.

SUMMARY OF THE INVENTION

An object of the present invention is to provide a semiconductor device in which a parasitic action is suppressed.

A semiconductor device according to the present invention includes: a first conductivity-type first semiconductor region formed to extend in a planar manner; a second conductivity-type second semiconductor region located on or above the first semiconductor region; a second conductivity-type third semiconductor region located on or above the first semiconductor region and formed apart from the second semiconductor region; a second conductivity-type fourth semiconductor region located on or above the first semiconductor region and formed apart from the second semiconductor region and the third semiconductor region between the second semiconductor region and the third semiconductor region; a first conductivity-type fifth semiconductor region located on or above the first semiconductor region, located between the third semiconductor region and the fourth semiconductor region, and having a resistance lower than that of the first semiconductor region; a first electrode formed to be in contact with the second semiconductor region; a second electrode formed to be in contact with the third semiconductor region; and a third electrode formed in a region sandwiched by the second semiconductor region and the fourth semiconductor region. The fourth semiconductor region and the fifth semiconductor region are electrically connected by a conductive member. The semiconductor device is formed such that a distance between the fourth semiconductor region and the third semiconductor region is larger than a width of the fourth semiconductor region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Referring to FIGS. 1 to 5, a semiconductor device according to a first embodiment will be described. The semiconductor device according to the present embodiment is an npn-type bipolar transistor. In the present embodiment, a first conductivity type refers to a p type, while a second conductivity type refers to an n type.

Figure 1:
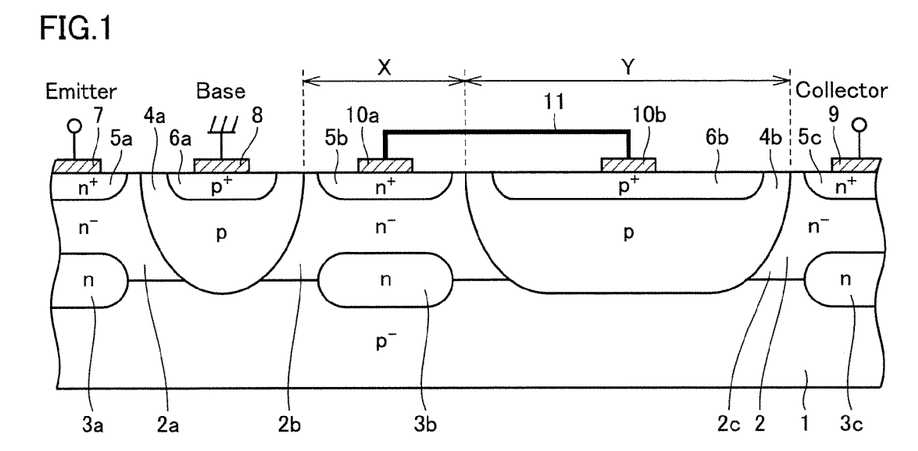
FIG. 1 is a first schematic cross section of a semiconductor device according to a first embodiment.

FIG. 1 is a first schematic cross section of the semiconductor device according to the present embodiment. The semiconductor device according to the present embodiment is formed at a $p^-$ substrate. A $p^-$ region 1 is formed out of the $p^-$ substrate to serve as a first conductivity-type first semiconductor region. $P^-$ region 1 is formed to extend in a planar manner. An $n^-$ epitaxial layer 2 is formed on or above $p^-$ region 1. $N^-$ regions $2a$-$2c$ are formed out of $n^-$ epitaxial layer 2.

The semiconductor device according to the present embodiment includes $n^-$ region $2a$ and an $n^+$ diffused region $5a$ which serve as an $n^-$ type second semiconductor region located on or above $p^-$ region 1. $N^+$ diffused region $5a$ and $n^-$ region $2a$ are formed in an emitter region of the transistor. $N^+$ diffused region $5a$ is located on or above $n^-$ region $2a$. $N^+$ diffused region $5a$ is formed to have a higher impurity concentration than $n^-$ region $2a$ has.

The semiconductor device according to the present embodiment includes an emitter electrode 7 which serves as a first electrode formed to be in contact with the second semiconductor region. Emitter electrode 7 is located at a surface of $n^+$ diffused region $5a$.

The semiconductor device according to the present embodiment includes $n^-$ region $2c$ and an $n^+$ diffused region $5c$ which serve as an $n^-$ type third semiconductor region located on or above $p^-$ region 1. $N^-$ region $2c$ and $n^+$ diffused region $5c$ are formed in a collector region of the transistor. $N^+$ diffused region $5c$ is located on or above $n^-$ region $2c$. $N^+$ diffused region $5c$ is formed to have a higher impurity concentration than $n^-$ region $2c$ has. $N^-$ region $2c$ and $n^+$ diffused region $5c$, which serve as the third semiconductor region, are located apart from $n^-$ region $2a$ and $n^+$ diffused region $5a$, which serve as the second semiconductor region.

The semiconductor device according to the present embodiment includes a collector electrode 9 serving as a second electrode formed to be in contact with the third semiconductor region. Collector electrode 9 is located at a surface of $n^+$ diffused region $5c$.

The semiconductor device according to the present embodiment includes $n^-$ region $2b$ and an $n^+$ diffused region $5b$ which serve as an $n^-$ type fourth semiconductor region located on or above $p^-$ region 1, $N^+$ diffused region $5b$ is formed to have a higher impurity concentration than $n^-$ region $2b$ has. $N^-$ region $2b$ and $n^+$ diffused region $5b$ are located apart from $n^-$ region $2a$ and $n^+$ diffused region $5a$, which serve as the second semiconductor region. Furthermore, $n^-$ region $2b$ and $n^+$ diffused region $5b$ are located apart from $n^-$ region $2c$ and $n^+$ diffused region $5c$, which serve as the third semiconductor region. The fourth semiconductor region is located between the second semiconductor region and the third semiconductor region. A floating electrode $10a$ is located at a surface of $n^+$ diffused region $5b$.

The semiconductor device according to the present embodiment includes a p diffused region $4b$ and a $p^+$ diffused region $6b$ which serve as a $p^-$ type fifth semiconductor region located on or above $p^-$ region 1. P diffused region $4b$ and $p^+$ diffused region $6b$ are located between the third semiconductor region composed of $n^-$ region $2c$ and $n^+$ diffused region $5c$, and the fourth semiconductor region composed of $n^-$ region $2b$ and $n^+$ diffused region $5b$. P diffused region $4b$ is formed to penetrate $n^-$ epitaxial layer 2 and to be in contact with $p^-$ region 1.

The fifth semiconductor region is formed to have a lower resistance than the first semiconductor region has. P diffused region $4b$ in the present embodiment is formed to have a higher impurity concentration than $p^-$ region 1 has. Furthermore, $p^+$ diffused region $6b$ is formed to have a higher impurity concentration than p diffused region $4b$ has.

A floating electrode $10b$ serving as a fourth electrode is located at a surface of $p^+$ diffused region $6b$. Floating electrode $10b$ is located at a center portion of $p^+$ diffused region $6b$. Floating electrode $10b$ and floating electrode $10a$ are electrically connected via a lead 11 serving as a conductive member. Lead 11 in the present embodiment is not connected to an external circuit. As such, in the present embodiment, the fourth semiconductor region and the fifth semiconductor region are electrically connected via the conductive member.

The semiconductor device according to the present embodiment includes a p diffused region $4a$ and a $p^+$ diffused region $6a$ which serve as a $p^-$ type sixth semiconductor region located on or above $p^-$ region 1. P diffused region $4a$ and $p^+$ diffused region $6a$ are formed in a base region of the transistor. P diffused region $4a$ is formed to penetrate $n^-$ epitaxial layer 2 and to be in contact with $p^-$ region 1. P diffused region $4a$ and $p^+$ diffused region $6a$, which serve as the sixth semiconductor region, are located between the second semiconductor region and the fourth semiconductor region.

The semiconductor device according to the present embodiment includes a base electrode 8 serving as a third electrode formed in a region sandwiched by the second semiconductor region and the fourth semiconductor region. Base electrode 8 is located at a surface of $p^+$ diffused region $6a$.

The semiconductor device according to the present embodiment includes n embedded regions $3a$-$3c$. N-embedded regions $3a$-$3c$ are formed to reduce resistance and suppress a parasitic action in respective regions.

The semiconductor device according to the present embodiment has n embedded region $3a$ serving as an n-type first embedded region formed to be in contact with a bottom portion of the second semiconductor region. N-embedded region $3a$ is formed to have a lower resistance than $n^-$ region $2a$ has. N-embedded region $3a$ is formed to have a higher impurity concentration than $n^-$ region $2a$ has. N-embedded region $3a$ is formed at a boundary portion between $p^-$ region 1 and $n^-$ region $2a$.

The semiconductor device according to the present embodiment includes n embedded region $3c$ serving as an n-type second embedded region formed to be in contact with a bottom portion of the third semiconductor region. N-embedded region 3c is formed to have a lower resistance than n⁻ region 2c has. N-embedded region 3c is formed to have a higher impurity concentration than n⁻ region 2c has. N-embedded region 3c is formed at a boundary portion between p⁻ region 1 and n⁻ region 2c.

The semiconductor device according to the present embodiment includes n embedded region 3b serving as an n-type third embedded region formed to be in contact with a bottom portion of the fourth semiconductor region. N-embedded region 3b is formed to have a lower resistance than n⁻ region 2b has. N-embedded region 3b is formed to have a higher impurity concentration than n⁻ region 2b has. N-embedded region 3b is formed at a boundary portion between p⁻ region 1 and n⁻ region 2b.

The semiconductor device according to the present embodiment is formed such that a distance Y between the fourth semiconductor region and the third semiconductor region is larger than a width X of the fourth semiconductor region. The semiconductor device is formed such that distance Y between n⁻ region 2b and n⁻ region 2c is larger than width X of n⁻ region 2b. The semiconductor device is formed such that a width of p diffused region 4b is larger than a width of n⁻ region 2b.

Figure 4:
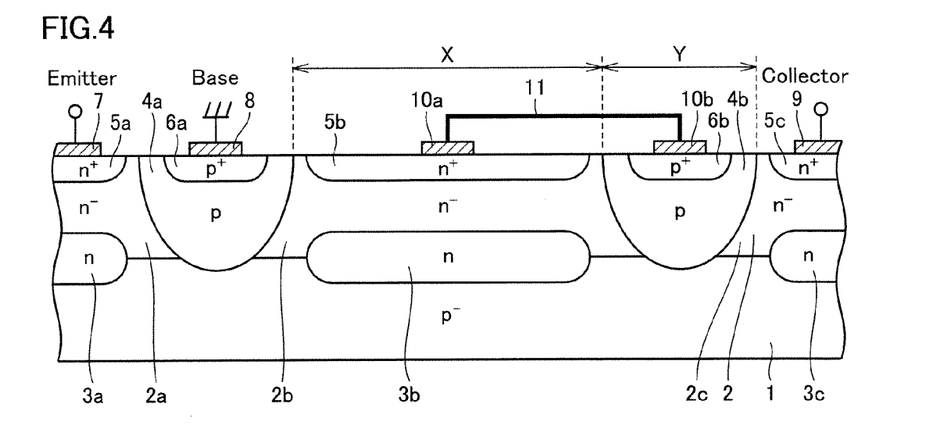
FIG. 4 is a first schematic cross section of a semiconductor device in a comparative example.

FIG. 4 shows a first schematic cross section of a semiconductor device serving as a comparative example in the present embodiment. In the semiconductor device in the comparative example, an npn transistor is formed at a surface of the p⁻ substrate. The semiconductor device in the comparative example is similar to that in the present embodiment in that n⁻ region 2b and n⁺ diffused region 5b, which serve as the fourth semiconductor region, and p diffused region 4b and p⁺ diffused region 6b, which serve as the fifth semiconductor region, are formed between the base region and the collector region.

The semiconductor device serving as the comparative example is formed such that width X of the fourth semiconductor region is larger than distance Y between the fourth semiconductor region and the third semiconductor region. The semiconductor device is formed such that the width of n⁻ region 2b is larger than the width of p diffused region 4b.

Figure 5:
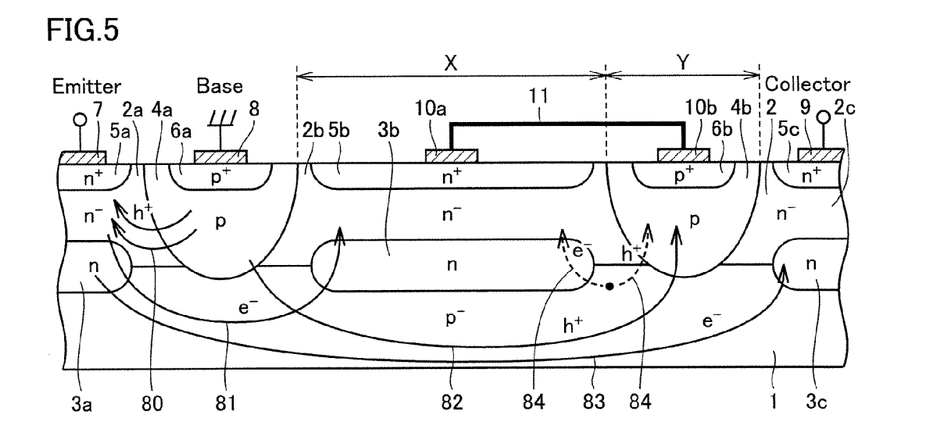
FIG. 5 is a second schematic cross section of the semiconductor device in the comparative example.

FIG. 5 is a second schematic cross section of the semiconductor device serving as the comparative example. FIG. 5 is a drawing for describing an action of the semiconductor device serving as the comparative example. In the semiconductor device, n⁻ region 2b and p diffused region 4b are electrically connected via floating electrodes 10a and 10b. The fourth semiconductor region including n⁻ region 2b is referred to as a dummy island region. This structure can prevent electrons injected from emitter electrode 7 from reaching collector electrode 9, when, for example, base electrode 8 assumes 0V and emitter electrode 7 assumes a negative potential.

For example, assume the case where a coil or the like of a motor is connected to an output terminal of an Integrated Circuit (IC). When an output current is switched from on to off on the IC side, a negative voltage [−(dI/dt)·L], which is attributable to an inductance of the coil, is generated and applied to the output terminal. Generally, the output terminal is often connected to an n⁻ type semiconductor region such as an emitter electrode. In such a case, the base electrode assumes a voltage of 0V, while the emitter electrode assumes a negative potential, so that electrons are injected from the emitter electrode.

Referring to FIG. 5, h⁺ refers to a hole, while e⁻ refers to an electron. When base electrode 8 assumes 0V and emitter electrode 7 assumes a negative potential in the semiconductor device in the comparative example, electrons are injected from emitter electrode 7 toward p⁻ region 1. At the same time, holes are supplied from base electrode 8.

Some of the electrons injected from emitter electrode 7 flow into n⁻ region 2b as shown by an arrow 81. In other words, the electrons flow into the dummy island. Some of the supplied holes flow from p diffused region 4a to n⁻ region 2a as shown by an arrow 80. Furthermore, some of the holes, along with some of the electrons, are diffused in p⁻ region 1 as shown by an arrow 82, resulting in conductivity modulation. Some of the holes flow into p diffused region 4b as shown by arrow 82. Electrons and holes generated in p⁻ region 1 in the proximity of n⁻ region 2b and p diffused region 4b flow into n⁻ region 2b or p diffused region 4b as shown by an arrow 84.

N⁻ region 2b and p diffused region 4b are electrically connected to each other via floating electrodes 10a and 10b and lead 11, so that the electrons flowing into n⁻ region 2b and the holes flowing into p diffused region 4b are recombined together. Accordingly, the electrons are prevented from reaching collector electrode 9.

In the semiconductor device in the comparative example, n⁻ region 2b serving as a region of the dummy island is made as large as possible, from the viewpoint of capturing thereat the electrons injected into p⁻ region 1. Furthermore, n embedded region 3b is formed in the region of the dummy island.

In the semiconductor device in the comparative example, the holes flowing under n⁻ region 2b, namely, the region of the dummy island, are diffused so far as to reach p diffused region 4b as shown by arrow 82. Some of the electrons are diffused following the same path as that of a hole current, owing to the effect of charge neutralization. Accordingly, some of the electrons are diffused so far as to reach the proximity of n⁻ region 2c as shown by an arrow 83, resulting in a state where the electrons are likely to reach collector electrode 9. Furthermore, some of the holes are diffused so far as to reach p⁺ diffused region 6b at a distance and are later recombined with the electrons, which causes decrease in efficiency of recombination.

Figure 2:
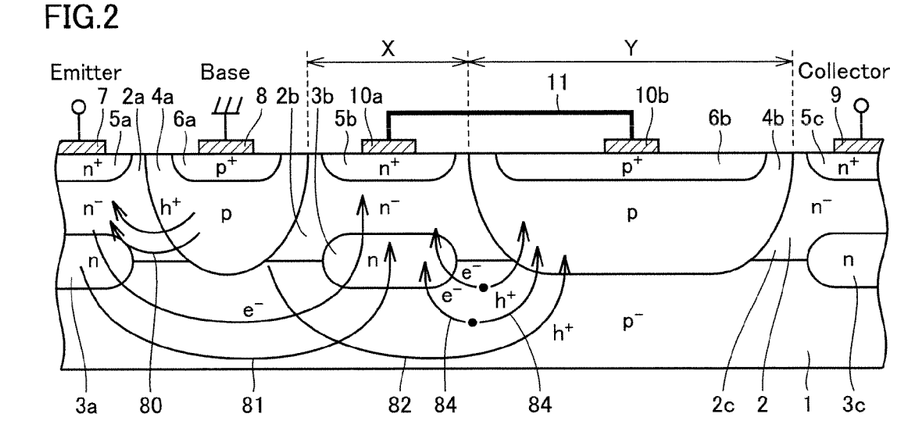
FIG. 2 is a second schematic cross section of the semiconductor device according to the first embodiment.

FIG. 2 is a second schematic cross section of the semiconductor device according to the present embodiment. FIG. 2 is a drawing for describing an action of the semiconductor device according to the present embodiment. If base electrode 8 assumes 0V and emitter electrode 7 assumes a negative potential, electrons are injected from emitter electrode 7 toward p⁻ region 1. At the same time, holes are supplied from base electrode 8.

The supplied holes, along with the injected electrons, are diffused in p⁻ region 1, resulting in conductivity modulation. The electrons causing conductivity modulation flow into n⁻ region 2b. Here, width X of n⁻ region 2b is small, and hence the holes easily reach p diffused region 4b as shown by arrow 82. Accordingly, the electrons flowing into n⁻ region 2b and the holes flowing into p diffused region 4b are effectively recombined together. Furthermore, p diffused region 4b is wide, which makes it possible to prevent some of the electrons from being diffused toward n⁻ region 2c, and prevent the electrons from reaching collector electrode 9.

Furthermore, conductivity modulation occurs in the proximity of base electrode 8, so that there disappears potential difference between the emitter region and the base region, resulting in that the dummy island region assumes a negative potential under the influence of the emitter region. Here, floating electrode 10a and floating electrode 10b are electrically connected, and hence this negative potential is transmitted to p⁺ diffused region 6b serving as the fifth semiconductor region.

Accordingly, in the proximity of p diffused region 4b, there is formed a negative electric field where a potential is lowered as closer to the surface. Owing to this electric field, the holes are more effectively captured in p diffused region 4b. The smaller width X produces the larger effect of capturing these holes in $p^+$ diffused region 6b. Furthermore, this electric field serves as a potential barrier against the electrons injected into $p^-$ region 1, so that the electrons are further prevented from reaching $n^-$ region 2c. The larger distance Y produces the larger effect of allowing the electric field to serve as a potential barrier against these electrons.

As such, by forming the semiconductor device such that distance Y between the fourth semiconductor region and the third semiconductor region is larger than width X of the fourth semiconductor region, a parasitic action can effectively be suppressed.

Figure 3:
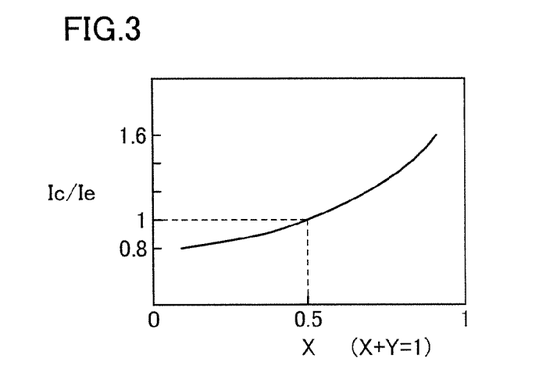
FIG. 3 is a graph for describing an effect of the semiconductor device according to the first embodiment.

FIG. 3 shows a graph for describing ratios of a collector current and an emitter current when a ratio of width X and distance Y is varied. An axis of abscissas represents the ratio of width X, while an axis of ordinates represents the current ratio between the collector current and the emitter current (Ic/Ie). In the graph in FIG. 3, the ratio between the collector current and the emitter current, which ratio is obtained when width X is equal to distance Y, is normalized to 1.

By varying width X, the current ratio (Ic/Ie) varies within a range of at least approximately 0.8 and at most approximately 1.6. It is found that the current ratio (Ic/Ie) is lowered when width X is decreased with respect to distance Y. As such, by making width X at least smaller than distance Y, a parasitic action can be suppressed.

In the present embodiment, the first conductivity type refers to a p type, while the second conductivity type refers to an n type. However, the present invention is not limited to this configuration, and the first conductivity type may refer to an n-type, while the second conductivity type may refer to a p type. For example, an npn transistor is used as an example for describing the present embodiment. However, the present invention is not limited to this configuration. The present invention may also be applied to a pnp transistor.

Second Embodiment

Figure 6:
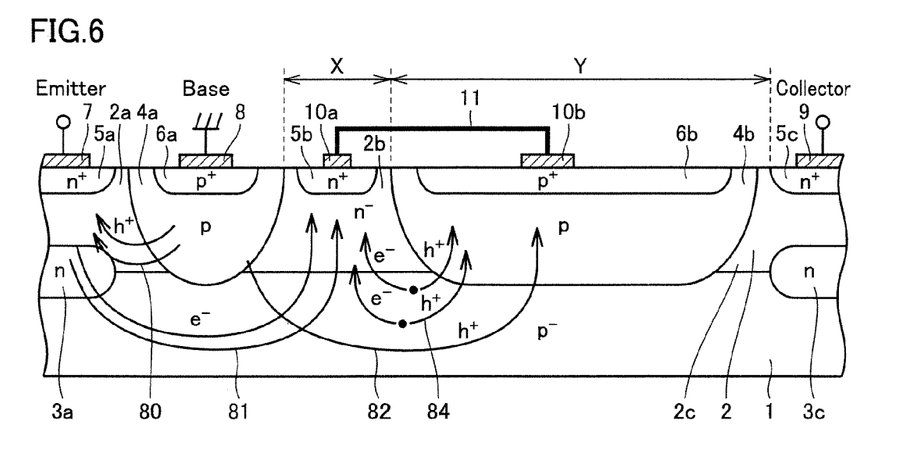
FIG. 6 is a schematic cross section of a semiconductor device according to a second embodiment.

Referring to FIG. 6, a semiconductor device according to a second embodiment will be described. The semiconductor device according to the present embodiment is different from the semiconductor device according to the first embodiment in that no embedded region is formed at the bottom portion of the fourth semiconductor region.

FIG. 6 is a schematic cross section of the semiconductor device according to the present embodiment. The semiconductor device according to the present embodiment is an npn-type bipolar transistor. The fourth semiconductor region of the semiconductor device according to the present embodiment has a configuration in which $n^-$ region 2b and $n^+$ diffused region 5b are included and no embedded region is formed at the bottom portion of the fourth semiconductor region. In other words, no embedded region is formed in the dummy island region.

By eliminating the embedded region to be formed at the bottom portion of $n^-$ region 2b, width X of $n^-$ region 2b can be made much smaller. As a result, distance Y between the fourth semiconductor region and the third semiconductor region becomes much larger than width X of the fourth semiconductor region, so that a parasitic action can further effectively be suppressed.

Other configurations, actions, and effects thereof are similar to those of the first embodiment, so that the description thereof will not be repeated here.

Third Embodiment

Figure 7:
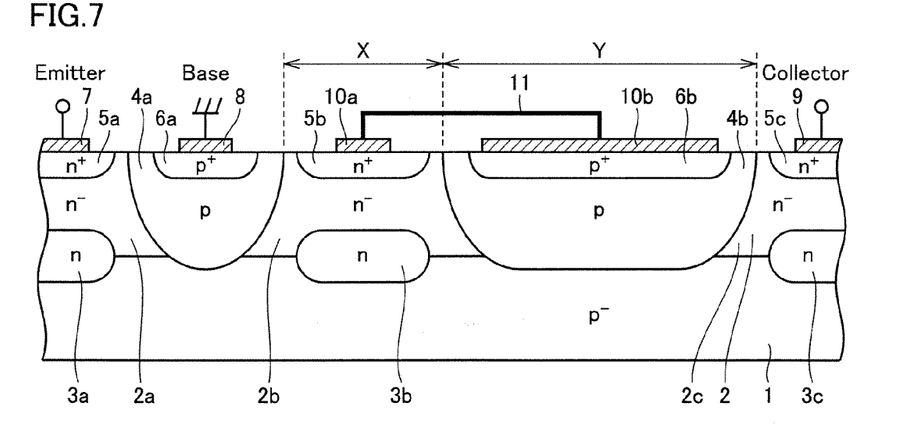
FIG. 7 is a schematic cross section of a first semiconductor device according to a third embodiment.
Figure 8:
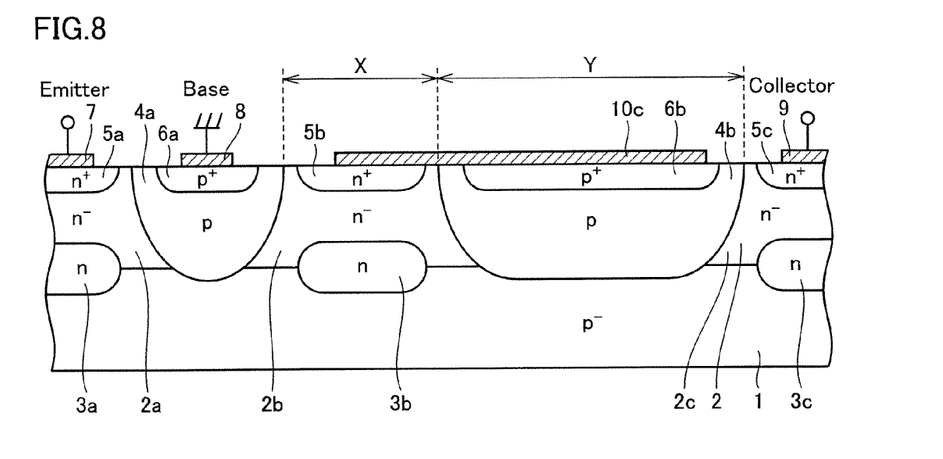
FIG. 8 is a schematic cross section of a second semiconductor device according to the third embodiment.

Referring to FIGS. 7 and 8, a semiconductor device according to a third embodiment will be described. The semiconductor device according to the present embodiment is different from the semiconductor device according to the first embodiment in terms of the configuration of the floating electrode.

FIG. 7 is a schematic cross section of a first semiconductor device according to the present embodiment. The semiconductor device according to the present embodiment includes p diffused region 4b and $p^+$ diffused region 6b as the fifth semiconductor region. Floating electrode 10b in the first semiconductor device is formed to occupy almost the entire region of $p^+$ diffused region 6b. Floating electrode 10b is formed to cover almost the entire surface of the fifth semiconductor region.

By adopting this configuration, a surface area of the floating electrode is increased, which makes it possible to further increase the effect of recombining electrons and holes. In addition, it is possible to further increase the effect of allowing the proximity of p diffused region 4b to assume a negative potential via $p^+$ diffused region 6b.

FIG. 8 is a schematic cross section of a second semiconductor device according to the present embodiment. The second semiconductor device includes a floating electrode 10c. Floating electrode 10c is formed continuously from $n^+$ diffused region 5b to $p^+$ diffused region 6b. Floating electrode 10c is formed continuously from the fourth semiconductor region to the fifth semiconductor region.

By adopting this configuration, it is possible to further increase the effect of recombining electrons and holes. In addition, it is possible to further increase the effect of allowing the proximity of p diffused region 4b to assume a negative potential via $p^+$ diffused region 6b.

The configuration of the floating electrode in the present embodiment may also be applied to the second embodiment, and fourth to seventh embodiments described below.

Other configurations, actions, and effects thereof are similar to those of the first embodiment, so that the description thereof will not be repeated here.

Fourth Embodiment

Figure 9:
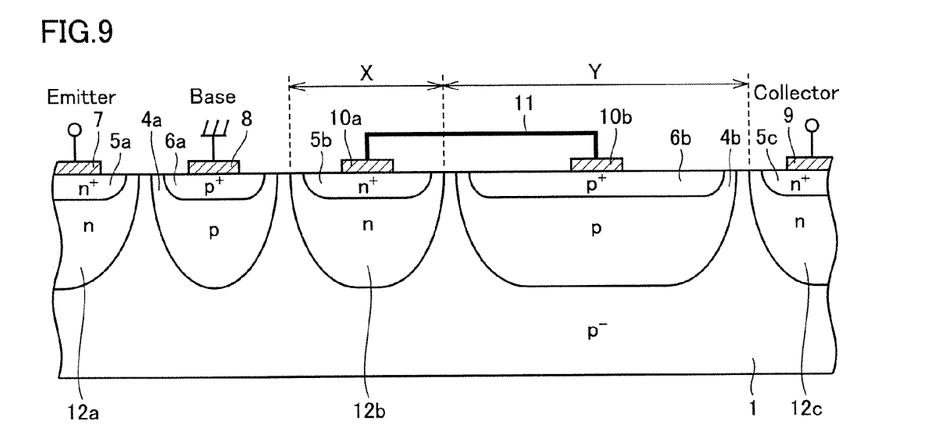
FIG. 9 is a schematic cross section of a semiconductor device according to a fourth embodiment.

Referring to FIG. 9, a semiconductor device according to a fourth embodiment will be described. The semiconductor device according to the present embodiment is different from the semiconductor device according to the first embodiment in that the embedded region is eliminated.

FIG. 9 is a schematic cross section of the semiconductor device according to the present embodiment. In the present embodiment, a $p^-$ substrate is used to form $p^-$ region 1 extending in a planar manner. On or above $p^-$ region 1, n diffused region 12a and $n^+$ diffused region 5a are formed to serve as the second semiconductor region. Furthermore, on or above $p^-$ region 1, n diffused region 12c and $n^+$ diffused region 5c are formed to serve as the third semiconductor region. Furthermore, on or above $p^-$ region 1, n diffused region 12b and $n^+$ diffused region 5b are formed to serve as the fourth semiconductor region.

In the semiconductor device according to the present embodiment, no $n^-$ epitaxial layer is formed on or above $p^-$ region 1. Furthermore, the embedded regions to be located at the bottom portions of the second semiconductor region, the third semiconductor region, and the fourth semiconductor region, respectively, are eliminated. In the $n^-$ type semiconductor region, the embedded region to be formed at a boundary between the n⁻ region and the p⁻ region is eliminated.

The semiconductor device according to the present embodiment can be applied to a device such as a Complementary Metal Oxide Semiconductor (CMOS). The CMOS is an element in which an NMOS and a PMOS, which serve as active elements, are formed adjacently. The embedded region is mainly used to lower resistance of an element that allows a current to flow through a diffused region. However, there exists an element such as a 5V-CMOS in which a current exclusively flows under an inversion layer. To such an element, it is possible to suitably apply the configuration where the embedded region is eliminated.

In the semiconductor device according to the present embodiment, a parasitic action can also be suppressed effectively.

Other configurations, actions, and effects thereof are similar to those of the first embodiment, so that the description thereof will not be repeated here.

Fifth Embodiment

Referring to FIGS. 10 to 13, a semiconductor device according to a fifth embodiment will be described. The semiconductor device according to the present embodiment is different from the semiconductor device according to the first embodiment in terms of the configuration of the fourth semiconductor region serving as the dummy island.

Figure 10:
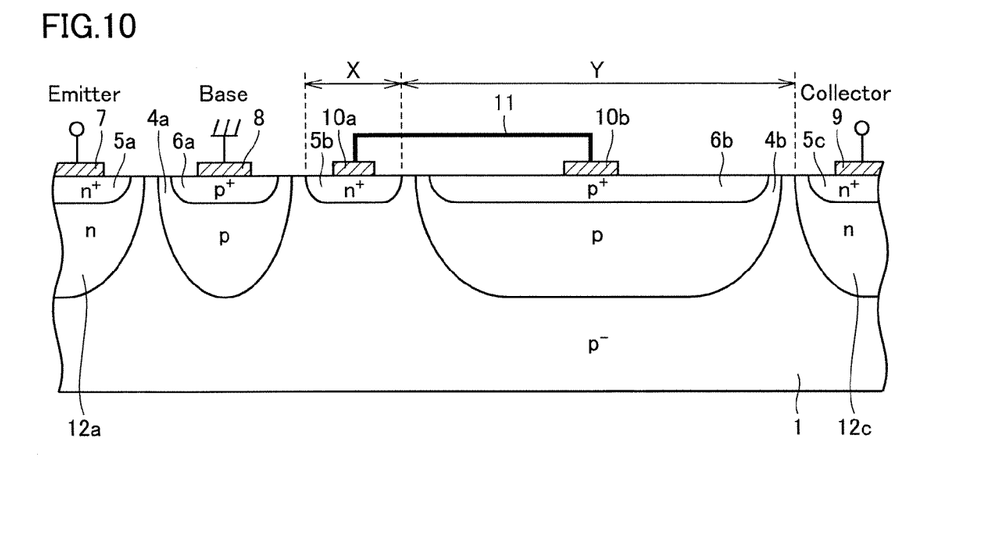
FIG. 10 is a schematic cross section of a first semiconductor device according to a fifth embodiment.

FIG. 10 is a schematic cross section of a first semiconductor device according to the present embodiment. The semiconductor device according to the present embodiment is different from the fourth embodiment in that the n diffused region is eliminated in the fourth semiconductor region. Under or below floating electrode 10a, there is formed n⁺ diffused region 5b serving as the fourth semiconductor region. Under or below n⁺ diffused region 5b, the n diffused region or the n region is not formed. The fourth semiconductor region is formed to have a depth smaller than that of the second semiconductor region composed of n⁺ diffused region 5a and n diffused region 12a. Furthermore, the fourth semiconductor region is formed to have a depth smaller than that of the third semiconductor region composed of n⁺ diffused region 5c and n diffused region 12c.

In the first semiconductor device according to the present embodiment, width X of the fourth semiconductor region serving as the dummy island region can be made much smaller, so that a parasitic action can effectively be suppressed.

Figure 11:
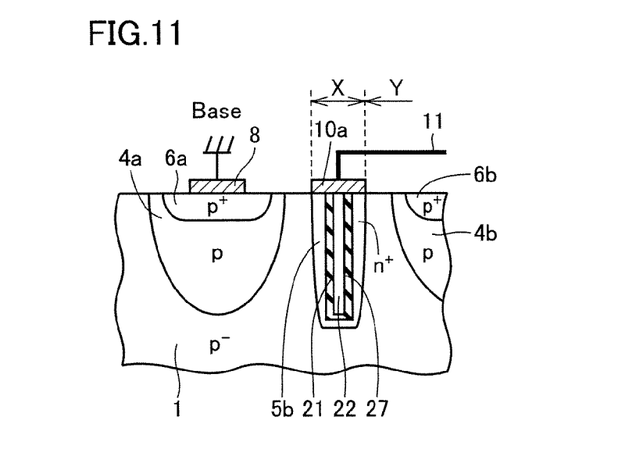
FIG. 11 is an enlarged schematic cross section of a second semiconductor device according to the fifth embodiment.

FIG. 11 is an enlarged schematic cross section of a second semiconductor device according to the present embodiment. FIG. 11 is an enlarged schematic cross section of the fourth semiconductor region.

In the second semiconductor device according to the present embodiment, n⁺ diffused region 5b serving as the fourth semiconductor region is formed around a groove (trench) portion 27. N⁺ diffused region 5b is formed to surround groove portion 27. In the second semiconductor device, groove portion 27 is formed on or above p⁻ region 1. An oxidized layer 21 is formed at a surface of groove portion 27. N⁺ diffused region 5b is formed around oxidized layer 21. An inside of groove portion 27 is filled with polysilicon serving as a filling portion 22. Floating electrode 10a is formed to be in contact with at least n⁺ diffused region 5b.

A method of manufacturing the second semiconductor device according to the present embodiment includes a step of forming groove portion 27 by anisotropic etching in the fourth semiconductor region. After groove portion 27 is formed, n⁺ doping is performed on a side surface of groove portion 27 to form n⁺ diffused region 5b. The side surface of groove portion 27 is then subjected to surface oxidation to form oxidized layer 21. The inside of groove portion 27 is then filled with polysilicon to form filling portion 22. Afterwards, floating electrode 10a is formed.

In the second semiconductor device according to the present embodiment, n⁺ diffused region 5b serving as the fourth semiconductor region is formed along a wall surface of groove portion 27. With this configuration, width X of the fourth semiconductor region can be made much smaller, so that a parasitic action can effectively be suppressed.

Figure 12:
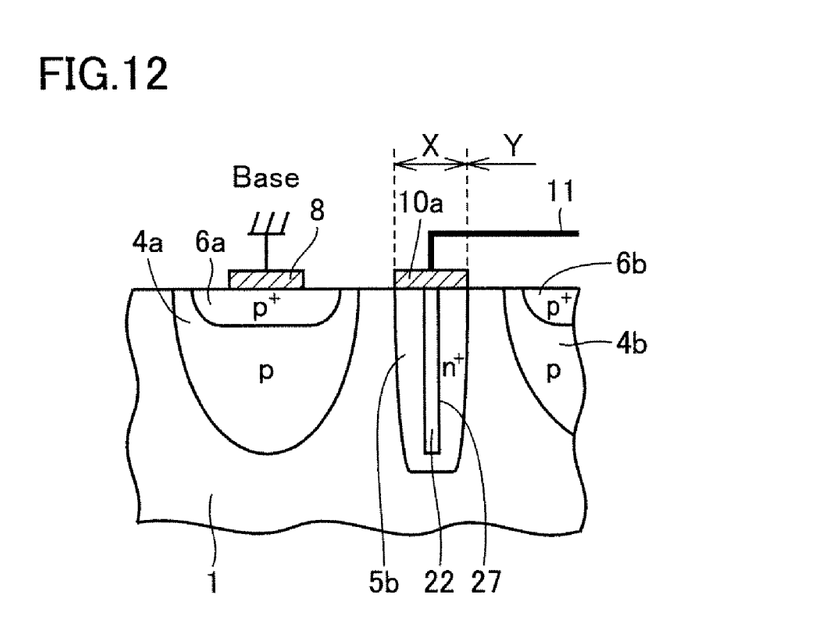
FIG. 12 is an enlarged schematic cross section of a third semiconductor device according to the fifth embodiment.

FIG. 12 is an enlarged schematic cross section of a third semiconductor device according to the present embodiment. FIG. 12 is an enlarged schematic cross section of the fourth semiconductor region.

The third semiconductor device according to the present embodiment includes n⁺ diffused region 5b serving as the fourth semiconductor region. N⁺ diffused region 5b is formed at a wall surface of groove portion 27. N⁺ diffused region 5b is formed along the wall surface around groove portion 27. An inside of groove portion 27 is filled with polysilicon or the like serving as filling portion 22. Floating electrode 10a is formed to be in contact with at least n⁺ diffused region 5b.

A method of manufacturing the third semiconductor device includes the steps of forming groove portion 27 in the fourth semiconductor region by anisotropic etching, and subsequently performing n⁺ doping on the side surface of groove portion 27. Filling portion 22 is then formed by embedding polysilicon inside groove portion 27. Subsequently, floating electrode 10a is formed to be in contact with n⁺ diffused region 5b.

In the third semiconductor device, width X of the fourth semiconductor region can also be made much smaller, which makes it possible to effectively suppress a parasitic action. In addition, no oxidized layer is formed at the wall surface of the groove portion, and hence resistance can be made small.

Figure 13:
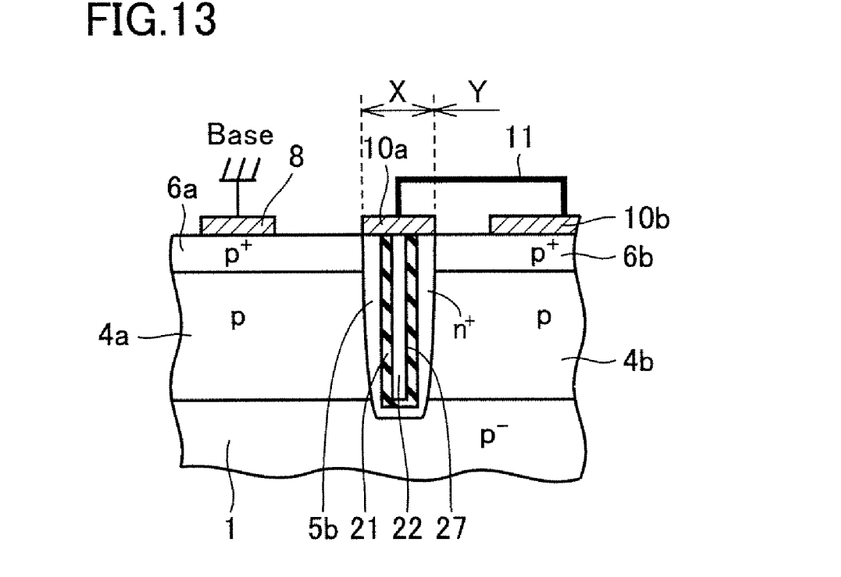
FIG. 13 is an enlarged schematic cross section of a fourth semiconductor device according to the fifth embodiment.

FIG. 13 is an enlarged schematic cross section of a fourth semiconductor device according to the present embodiment. FIG. 13 is an enlarged schematic cross section of the fourth semiconductor region.

In the fourth semiconductor device according to the present embodiment, the sixth semiconductor region having base electrode 8 connected thereto and the fifth semiconductor region having floating electrode 10b connected thereto are formed integrally. The fourth semiconductor region is formed to be a partition located between these two semiconductor regions.

In the fourth semiconductor device, p⁻ region 1 is formed in a planar manner. At the surface of p⁻ region 1, there are formed p diffused regions 4a and 4b. At the surfaces of p⁻ diffused regions 4a and 4b, there are formed p⁺ diffused regions 6a and 6b. The sixth semiconductor region includes p diffused region 4a and p⁺ diffused region 6a. The fifth semiconductor region includes p diffused region 4b and p⁺ diffused region 6b.

The fourth semiconductor region includes n⁺ diffused region 5b. N⁺ diffused region 5b is formed to be in contact with p⁻ region 1. Groove portion 27 is formed in the fourth semiconductor region. N⁻ diffused region 5b is formed to extend along the wall surface of groove portion 27. At the side surface of groove portion 27, there is formed oxidized layer 21, around which n⁺ diffused region 5b is formed. As such, in the present embodiment, the fourth semiconductor region is formed to separate the fifth semiconductor region and the sixth semiconductor region.

In the fourth semiconductor device, width X of the fourth semiconductor region can also be made much smaller, which makes it possible to effectively suppress a parasitic action. Furthermore, in the fourth semiconductor device, p diffused region 4a and p diffused region 4b can be formed integrally during a manufacturing step. Moreover, p$^+$ diffused region 6a and p$^+$ diffused region 6b can be formed integrally. As to the configuration of the groove portion, an oxidized layer may not be formed at the wall surface of the groove portion, as in the third semiconductor device in the present embodiment.

In the present embodiment, the inside of the groove portion is filled with polysilicon. However, the present invention is not limited to this configuration. For example, the inside of the groove portion may be filled with oxide.

Other configurations, actions, and effects thereof are similar to those of the first embodiment, so that the description thereof will not be repeated here.

Sixth Embodiment

Figure 14:
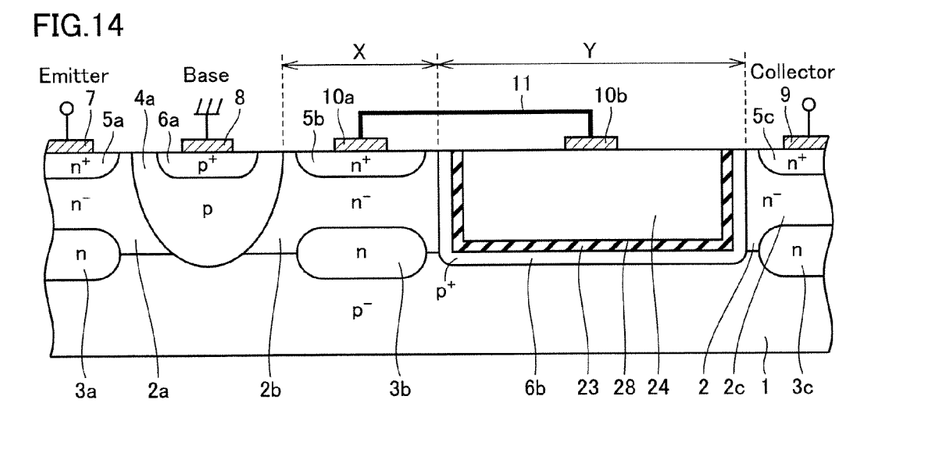
FIG. 14 is a schematic cross section of a semiconductor device according to a sixth embodiment.
Figure 15:
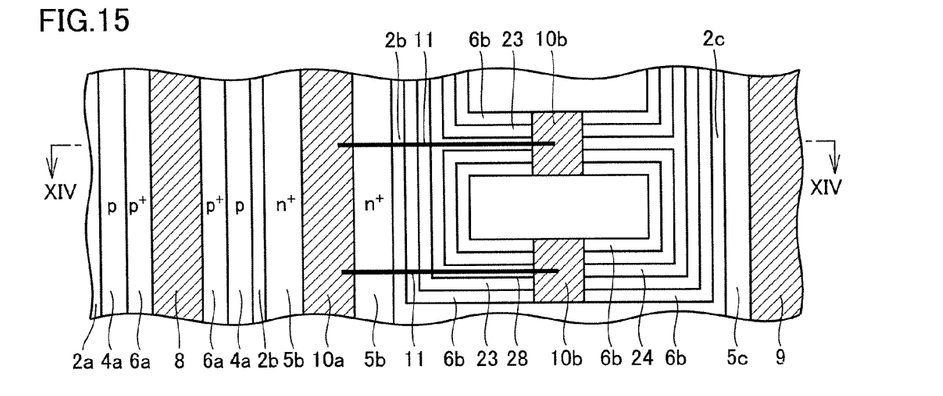
FIG. 15 is a schematic plan view of the semiconductor device according to the sixth embodiment.

Referring to FIGS. 14 and 15, a semiconductor device according to a sixth embodiment will be described. The semiconductor device according to the present embodiment is different from the semiconductor device according to the first embodiment in terms of the configuration of the fifth semiconductor region.

FIG. 14 is a schematic cross section of the semiconductor device according to the present embodiment. FIG. 14 is a cross sectional view taken along a line XIV-XIV in FIG. 15. The fifth semiconductor region in the semiconductor device according to the present embodiment includes p$^+$ diffused region 6b. In the present embodiment, a groove portion 28 is formed in the fifth semiconductor region. An oxidized layer 23 is formed at a side surface of groove portion 28. At an inside of groove portion 28, there is formed a filling portion 24 filled with polysilicon.

P$^+$ diffused region 6b is formed around oxidized layer 23. P$^-$ diffused region 6b is formed to extend along a wall surface of groove portion 28. P$^-$ diffused region 6b is formed to be in contact with p$^-$ region 1. P$^+$ diffused region 6b is formed to have a higher impurity concentration than p$^-$ region 1 has.

FIG. 15 is a schematic plan view of the semiconductor device according to the present embodiment. In the semiconductor device according to the present embodiment, each of base electrode 8 and collector electrode 9 is formed in a band-like manner. Furthermore, in the semiconductor device according to the present embodiment, floating electrode 10a is formed in a band-like manner. Floating electrode 10a is formed to extend in a direction approximately parallel to base electrode 8. Floating electrode 10a is brought into contact with n$^+$ diffused region 5b.

Floating electrodes 10b in the present embodiment are formed to be spaced apart from one another. Floating electrodes 10b in the present embodiment are formed in a discrete manner. Each of floating electrodes 10b is formed to be in contact with p$^+$ diffused region 6b. Groove portion 28 is formed in a ladder-like manner. Filling portions 24, oxidized layers 23, and p$^+$ diffused regions 6b are formed in a ladder-like manner to extend along a shape of groove portion 28.

In the semiconductor device according to the present embodiment, it is possible to have the great effect of allowing a negative potential of floating electrodes 10a and 10b to affect p$^-$ region 1. Accordingly, in p$^+$ diffused region 6b of the fifth semiconductor region, it is possible to more effectively allow the electric field to capture holes. Furthermore, a potential barrier against electrons is strengthened, which makes it possible to more effectively prevent electrons from reaching collector electrode 9.

In the present embodiment, filling portion 24 filled with polysilicon and electrode 10b are brought into contact with each other. With this configuration, it is possible to increase the effect of allowing the negative electric field to affect p$^-$ region 1.

In the present embodiment, the inside of the groove portion is filled with polysilicon. However, the present invention is not limited to this configuration. For example, the inside of the groove portion may be filled with oxide. Although the oxidized layer is formed at the wall surface of the groove portion, the present invention is not limited to this configuration, and the oxidized layer may not be formed. The oxidized layer and the p$^+$ diffused region around the groove portion can be formed by a manufacturing method similar to that of the configurations around the groove portion described in the sixth embodiment.

The configuration of the fifth semiconductor region according to the present embodiment may also be adopted in the semiconductor device described in each of the first embodiment, the second embodiment, the fourth embodiment, the fifth embodiment, and the seventh embodiment, which makes it possible to produce similar actions and effects.

Other configurations, actions, and effects thereof are similar to those of the first embodiment, so that the description thereof will not be repeated here.

Seventh Embodiment

Figure 16:
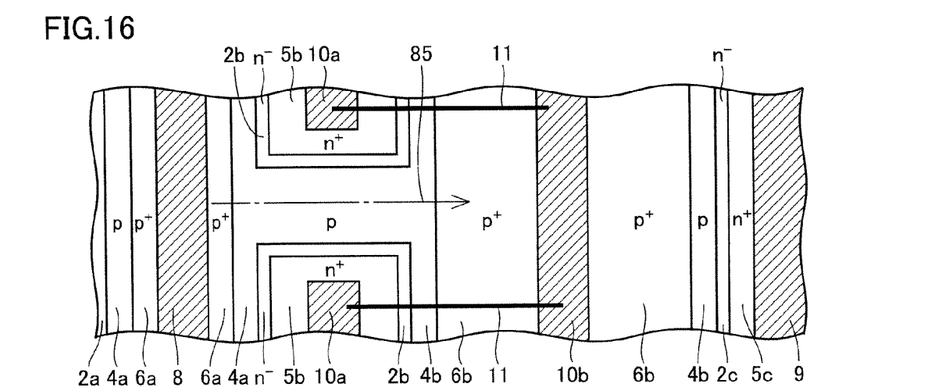
FIG. 16 is a schematic plan view of a semiconductor device according to a seventh embodiment.

Referring to FIG. 16, a semiconductor device according to a seventh embodiment will be described.

FIG. 16 is a schematic plan view of the semiconductor device according to the present embodiment. In the semiconductor device according to the present embodiment, the fourth semiconductor regions, each of which serves as the dummy island region, are formed in a discrete manner. In the present embodiment, the floating electrodes, each of which is connected to the fourth semiconductor region, are formed in a discrete manner.

The fourth semiconductor region in the semiconductor device according to the present embodiment has n$^-$ region 2b and n$^-$ diffused region 5b. N$^+$ diffused region 5b and n$^-$ region 2b in the present embodiment are formed in an island-like manner. N$^+$ diffused region 5b is formed to be rectangular in a planar shape. N$^-$ region 2b is formed to surround n$^+$ diffused region 5b. Around n$^-$ region 2b, there are formed p diffused regions 4a and 4b, which are formed integrally. No embedded region is formed at the bottom portion of n$^-$ region 2b. In the present embodiment, a p$^-$ type region is formed between the fourth discrete semiconductor regions.

In the present embodiment, a plurality of fourth semiconductor regions are formed. The fourth semiconductor regions are formed in a row in a direction perpendicular to a direction from the second semiconductor region to the third semiconductor region. In the fourth semiconductor regions, there are formed floating electrodes 10a, respectively, which are formed in a discrete manner. Floating electrode 10b is formed in a band-like manner.

Each of base electrode 8 and collector electrode 9 is formed in a band-like manner. Base electrode 8 and collector electrode 9 are formed to extend approximately in parallel with floating electrode 10b. Floating electrode 10a and floating electrode 10b are electrically connected via lead 11.

In the semiconductor device according to the present embodiment, holes injected from base electrode 8 pass between the fourth semiconductor regions and reach floating electrode 10b as shown by an arrow 85. Accordingly, recombination of electrons and holes by floating electrodes 10a and 10b can more effectively be provided.

The configuration according to the present embodiment may be adopted in the semiconductor device described in any of the first to sixth embodiments, which makes it possible to produce similar actions and effects.

Other configurations, actions, and effects thereof are similar to those of the first embodiment, so that the description thereof will not be repeated here.

In each of the drawings described above, the same or corresponding portions are provided with the same reference characters. In the present invention, a description such as on or under refers to not an absolute upward direction or downward direction in a vertical direction, but respective relative positional relations.

According to the present invention, it is possible to provide a semiconductor device in which a parasitic action is suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a first conductivity-type first semiconductor region formed to extend in a planar manner;
    a second conductivity-type second semiconductor region located on or above said first semiconductor region;
    a second conductivity-type third semiconductor region located on or above said first semiconductor region and formed apart from said second semiconductor region;
    a second conductivity-type fourth semiconductor region located on or above said first semiconductor region and formed apart from said second semiconductor region and said third semiconductor region between said second semiconductor region and said third semiconductor region;
    a first conductivity-type fifth semiconductor region located on or above said first semiconductor region, located between said third semiconductor region and said fourth semiconductor region, and having a resistance lower than that of the first semiconductor region;
    a first electrode formed to be in contact with said second semiconductor region;
    a second electrode formed to be in contact with said third semiconductor region; and
    a third electrode formed in a region sandwiched by said second semiconductor region and said fourth semiconductor region, wherein
    said fourth semiconductor region and said fifth semiconductor region are electrically connected by a conductive member, and
    a distance between said fourth semiconductor region and said third semiconductor region is larger than a width of said fourth semiconductor region.

2. The semiconductor device according to claim 1, comprising a fourth electrode located at a surface of said fifth semiconductor region and connected to said conductive member, wherein
    said fourth electrode is formed to be in contact with almost the entire surface of said fifth semiconductor region.

3. The semiconductor device according to claim 1, wherein a plurality of said fourth semiconductor regions are formed in a discrete manner in a direction perpendicular to a direction from said second semiconductor region to said third semiconductor region.

4. The semiconductor device according to claim 1, wherein a groove portion is formed between said second semiconductor region and said third semiconductor region, and said fourth semiconductor region is formed to extend along a wall surface of said groove portion.

5. The semiconductor device according to claim 2, wherein a groove portion is formed between said second semiconductor region and said third semiconductor region, and said fourth semiconductor region is formed to extend along a wall surface of said groove portion.

6. The semiconductor device according to claim 3, wherein a groove portion is formed between said second semiconductor region and said third semiconductor region, and said fourth semiconductor region is formed to extend along a wall surface of said groove portion.

7. The semiconductor device according to claim 1, wherein a groove portion is formed between said second semiconductor region and said third semiconductor region, and said fifth semiconductor region is formed to extend along a wall surface of said groove portion.

8. The semiconductor device according to claim 2, wherein a groove portion is formed between said second semiconductor region and said third semiconductor region, and said fifth semiconductor region is formed to extend along a wall surface of said groove portion.

9. The semiconductor device according to claim 3, wherein a groove portion is formed between said second semiconductor region and said third semiconductor region, and said fifth semiconductor region is formed to extend along a wall surface of said groove portion.

10. The semiconductor device according to claim 1, comprising
    a second conductivity-type first embedded region formed to be in contact with a bottom portion of said second semiconductor region and having a resistance lower than that of said second semiconductor region, and
    a second conductivity-type second embedded region formed to be in contact with a bottom portion of said third semiconductor region and having a resistance lower than that of said third semiconductor region.

11. The semiconductor device according to claim 2, comprising
    a second conductivity-type first embedded region formed to be in contact with a bottom portion of said second semiconductor region and having a resistance lower than that of said second semiconductor region, and
    a second conductivity-type second embedded region formed to be in contact with a bottom portion of said third semiconductor region and having a resistance lower than that of said third semiconductor region.

12. The semiconductor device according to claim 3, comprising
    a second conductivity-type first embedded region formed to be in contact with a bottom portion of said second semiconductor region and having a resistance lower than that of said second semiconductor region, and
    a second conductivity-type second embedded region formed to be in contact with a bottom portion of said third semiconductor region and having a resistance lower than that of said third semiconductor region.

13. The semiconductor device according to claim 1, wherein said fourth semiconductor region is formed to have a depth smaller than that of said second semiconductor region, and than that of said third semiconductor region.

14. The semiconductor device according to claim 2, wherein said fourth semiconductor region is formed to have a depth smaller than that of said second semiconductor region, and than that of said third semiconductor region.

15. The semiconductor device according to claim 3, wherein said fourth semiconductor region is formed to have a depth smaller than that of said second semiconductor region, and than that of said third semiconductor region.

* * * * *